US012681097B2

(12) United States Patent
Ledfelt et al.

(10) Patent No.: US 12,681,097 B2
(45) Date of Patent: Jul. 14, 2026

(54) METHOD FOR DETERMINING THE ASSOCIATION OF A SENSOR DEVICE WITH AN ELECTRIC BATTERY UNIT

(71) Applicant: TRATON AB, Södertälje (SE)

(72) Inventors: Gunnar Ledfelt, Nykvarn (SE); Per Nordvall, Trosa (SE); Mathias Eggeling, Augsburg (DE)

(73) Assignee: TRATON AB, Södertälje (SE)

( * ) Notice: Subject to any disclaimer, the term of this patent is extended or adjusted under 35 U.S.C. 154(b) by 506 days.

(21) Appl. No.: 18/256,461

(22) PCT Filed: Oct. 29, 2021

(86) PCT No.: PCT/EP2021/080129
§ 371 (c)(1),
(2) Date: Jun. 8, 2023

(87) PCT Pub. No.: WO2022/128227
PCT Pub. Date: Jun. 23, 2022

(65) Prior Publication Data
US 2024/0069114 A1     Feb. 29, 2024

(30) Foreign Application Priority Data

Dec. 16, 2020     (SE) .................................... 2051475-8

(51) Int. Cl.
G01R 31/3842     (2019.01)
H01M 10/44     (2006.01)
(Continued)

(52) U.S. Cl.
CPC ...... *G01R 31/3842* (2019.01); *H01M 10/441* (2013.01); *H01M 10/48* (2013.01); *H01M 50/583* (2021.01)

(58) Field of Classification Search
CPC ............ G01R 31/3842; H01M 50/583; H01M 10/441; H01M 10/48
See application file for complete search history.

(56) References Cited

U.S. PATENT DOCUMENTS

2004/0174141 A1* 9/2004 Luz ........................ G01R 31/36
320/132
2007/0032915 A1* 2/2007 Yamaguchi ........... H02J 7/1423
701/1
(Continued)

FOREIGN PATENT DOCUMENTS

JP     2002308026 A     10/2002
JP     2017091853 A     5/2017

OTHER PUBLICATIONS

International Search Report and Written Opinion mailed Feb. 24, 2022, for priority International Application No. PCT/EP2021/080129.

*Primary Examiner* — Catherine T. Rastovski
*Assistant Examiner* — Sharad Timilsina
(74) *Attorney, Agent, or Firm* — Renner, Otto, Boisselle & Sklar, LLP

(57) ABSTRACT

A method for determining the association of a sensor device with a battery unit. A first circuit includes a first battery unit. A second circuit includes a second battery unit. An electric current limiting device connects the circuits to one another. A first sensor device detects a voltage or a current associated with one of the first and second battery units while a second sensor device detects a voltage or a current associated with the other one of the first and second battery units. The method includes activating an electrical energy consumer or an electrical energy producer of the first circuit, and upon detection of a voltage change or a current change by one of the first and second sensor devices, determining that the one of the first and second sensor devices which detects a voltage (Continued)

change or a current change is associated with the first battery unit.

14 Claims, 10 Drawing Sheets

(51) Int. Cl.
*H01M 10/48* (2006.01)
*H01M 50/583* (2021.01)

(56) References Cited

U.S. PATENT DOCUMENTS

| 2014/0055094 | A1  | 2/2014 | Takagi    |            |
| 2014/0117851 | A1* | 5/2014 | Chen      | H05B 45/37 |
|              |     |        |           | 315/86     |
| 2018/0134160 | A1* | 5/2018 | Kratzer   | B60K 1/04  |
| 2019/0232791 | A1* | 8/2019 | Kinoshita | B60L 7/18  |
| 2020/0198562 | A1  | 6/2020 | Uchimura  |            |

* cited by examiner

METHOD FOR DETERMINING THE ASSOCIATION OF A SENSOR DEVICE WITH AN ELECTRIC BATTERY UNIT

This application is a national phase of International Application No. PCT/EP2021/080129 filed Oct. 29, 2021, which claims priority to Swedish Application No. 2051475-8 filed Dec. 16, 2020, each of which is hereby incorporated herein by reference in their entities.

TECHNICAL FIELD

Aspects of the present invention relate to a method for determining the association of a sensor device with an electric battery unit of a plurality of electric battery units.

BACKGROUND

When having one or more electric battery units included in an electrical arrangement, it may be desirable to monitor, for example by measurements, the one or more electric batteries. For example, this may be the case when the one or more electric batteries are included in a vehicle.

SUMMARY

When a plurality of electric battery units is included in an electrical arrangement and each electric battery unit of the plurality of electric battery units is to be monitored, a plurality of sensor devices is often required. When having a plurality of electric battery units and a plurality of sensor devices, it is often desirable to make sure that a specific sensor device is connected to monitor a specific electric battery unit of the plurality of electric battery units. If two or more sensor devices are installed in an unpredicted manner with regard to the plurality of electric battery units and thus are mixed up, data from the plurality of electric battery units can be mixed up, which can result in severe consequences. The inventors of the present invention have found drawbacks in conventional solutions for making sure that a specific sensor device is connected to monitor a specific electric battery unit of a plurality of electric battery units. In some conventional solutions, physically different sensor devices or physically different connection arrangements for the sensor devices are required to make sure that a specific sensor device is connected to monitor a specific electric battery unit of the plurality of electric battery units.

An object of the invention is to provide a solution which mitigates or solves the drawbacks and problems of conventional solutions.

The above and further objects are solved by the subject matter of the independent claims. Further advantageous embodiments of the invention can be found in the dependent claims.

According to a first aspect of the invention, the above mentioned and other objects are achieved with a method for determining the association of a sensor device with an electric battery unit of a plurality of electric battery units, wherein the plurality of electric battery units is connected to an electrical arrangement, wherein the electrical arrangement comprises a first electrical circuit comprising a first electric battery unit of the plurality of electric battery units, wherein the electrical arrangement comprises a second electrical circuit comprising a second electric battery unit of the plurality of electric battery units, wherein the electrical arrangement comprises an electric current limiting device connecting the first electrical circuit to the second electrical circuit, and wherein a first sensor device is connected to detect any one of a voltage and an electric current associated with one of the first and second electric battery units while a second sensor device is connected to detect any one of a voltage and an electric current associated with the other one of the first and second electric battery units, wherein the method comprises:

activating any one of an electrical energy consumer and an electrical energy producer included in the first electrical circuit, and upon detection of any one of a voltage change and an electric current change by one of the first and second sensor devices, determining that the one of the first and second sensor devices which detects any one of a voltage change and an electric current change is associated with the first electric battery unit of the first electrical circuit.

It may be defined that the plurality of electric battery units is electrically connected to the electrical arrangement. It may be defined that the plurality of electric battery units is included in the electrical arrangement. It may be defined that the electric current limiting device is configured to limit the electric current between the first electrical circuit and the second electrical circuit. The electric current limiting device may be referred to as an electric current restricting device. It may be defined that the electric current limiting device is configured to electrically connect the first electrical circuit to the second electrical circuit. It is to be understood that the electrical energy consumer, which may be activated according to embodiments of the method according to the first aspect, is included in the first electrical circuit.

The electrical energy consumer may be any kind of electrical unit, circuit, apparatus, device or system consuming electrical energy, for example one or more of a group of: an electric motor; an electrical component; and a control system, such as an electronic control unit, ECU. However, other types of electrical energy consumers are possible. The electrical energy consumer may be defined as an electrical load. The electrical energy producer may be any kind of electrical unit, circuit, apparatus, device or system producing electrical energy, for example one or more of a group of: an electrical generator; an electric power converter, such as a DC-to-DC converter; and a fuel cell. However, other types of electrical energy producers are possible. Each electric battery unit of the plurality of electric battery units may comprise one or more electric batteries.

An advantage of the method according to the first aspect is that the physical structures or configurations of the first and second sensor devices can be substantially identical, i.e. the hardware of the first sensor device can be substantially identical to the hardware of the second sensor device, because with the aid of embodiments of the method there is no need for any visual or physical identification of the sensor devices. Instead, a sensor device can be identified by way of embodiments of the method after the first and second sensor devices have been installed. Thus, the production of the first and second sensor devices is facilitated and improved, since, in general, only one type of sensor device is required. Further, the installation of the first and second sensor devices is facilitated and improved, since any one of the first and second sensor devices can be connected at any position, because the association of any one of the first and second sensor devices with any one of the first and second electric battery unit can be performed after the installation, for example without any visual inspection of the first and second sensor devices or of the connection of the first and second sensor devices. Thus, the risk of installing one of the first and second sensor devices at a wrong location is reduced or minimized, or the risk of intermixing the first and second sensor devices is reduced or minimized. This is valid for the installation of the first and second sensor devices both upon assembly of an apparatus to be provided with the first and second sensor devices and upon later occurring maintenance work, for example upon the assembly of a vehicle at a production site and upon the later occurring maintenance of the vehicle, for example at a workshop, when said apparatus is in the form of a vehicle. An advantage of the method according to the first aspect is that it is better assured that a sensor device monitors the intended electric battery unit of a plurality of electric battery units. An advantage of the method according to the first aspect is that an improved procedure for associating a sensor device with an electric battery unit of a plurality of electric battery units is provided, or expressed alternatively, an advantage of the method according to the first aspect is that an improved procedure for determining which sensor device of a plurality of sensor devices monitors which electric battery unit of a plurality of electric battery units is provided.

In some embodiments of to the method according to the first aspect, both the step of activating an electrical energy consumer included in the first electrical circuit to consume electrical energy and the step of activating an electrical energy producer included in the first electrical circuit to produce electrical energy may be performed.

According to an advantageous embodiment of the method according to the first aspect, the method comprises determining the association of a sensor device with an electric battery unit of a plurality of electric battery units carried, or held, by a vehicle.

According to a further advantageous embodiment of the method according to the first aspect, one of the first and second sensor devices is connected to one of the first and second electric battery units while the other one of the first and second sensor devices is connected to the other one of the first and second electric battery units. An advantage of this embodiment is that a further improved procedure for associating a sensor device with an electric battery unit of a plurality of electric battery units is provided.

According to another advantageous embodiment of the method according to the first aspect, the electric current limiting device comprises a switching device switchable between a non-conducting state and a conducting state, wherein when the switching device is in the conducting state the switching device is configured to allow an electric current to pass, wherein when the switching device is in the non-conducting state the switching device is configured to interrupt an electric current, and wherein the method comprises:

when the switching device is in the non-conducting state, activating any one of an electrical energy consumer and an electrical energy producer included in the first electrical circuit.

An advantage of this embodiment is that a further improved procedure for associating a sensor device with an electric battery unit of a plurality of electric battery units is provided. The non-conducting state may be defined as an open state or position, and the conducting state may be defined as a closed state or position. For some embodiments, the switching device may be defined as an electrically operated or controlled switching device.

According to still another advantageous embodiment of the method according to the first aspect, the switching device comprises or consists of an electric battery master switch. An advantage of this embodiment is that a further improved procedure for associating a sensor device with an electric battery unit of a plurality of electric battery units is provided.

According to yet another advantageous embodiment of the method according to the first aspect, the method comprises:

switching the switching device to the non-conducting state before activating any one of an electrical energy consumer and an electrical energy producer included in the first electrical circuit.

An advantage of this embodiment is that a further improved procedure for associating a sensor device with an electric battery unit of a plurality of electric battery units is provided.

According to an advantageous embodiment of the method according to the first aspect, the electric current limiting device comprises an electrical one-way conducting device configured to conduct electric current in one direction only. An advantage of this embodiment is that a further improved procedure for associating a sensor device with an electric battery unit of a plurality of electric battery units is provided.

In some embodiments, the electric current limiting device comprises both a switching device and an electrical one-way conducting device.

According to a further advantageous embodiment of the method according to the first aspect, the electrical one-way conducting device comprises a diode. An advantage of this embodiment is that a further improved procedure for associating a sensor device with an electric battery unit of a plurality of electric battery units is provided.

According to another advantageous embodiment of the method according to the first aspect, the step of activating any one of an electrical energy consumer and an electrical energy producer included in the first electrical circuit comprises activating the electrical energy consumer to consume electrical energy, whereupon an electric current is supplied from the first electric battery unit and detected by one of the first and second sensor devices. An advantage of this embodiment is that a further improved procedure for associating a sensor device with an electric battery unit of a plurality of electric battery units is provided. An advantage of this embodiment is the method can be applied to many different electrical arrangements, since most electrical arrangements include an electrical energy consumer.

According to still another advantageous embodiment of the method according to the first aspect, the step of activating any one of an electrical energy consumer and an electrical energy producer included in the first electrical circuit comprises activating the electrical energy producer to produce electrical energy, whereupon the first electric battery unit is charged, and wherein the charging of the first electric battery unit is detected by one of the first and second sensor devices. An advantage of this embodiment is that a further improved procedure for associating a sensor device with an electric battery unit of a plurality of electric battery units is provided.

According to yet another advantageous embodiment of the method according to the first aspect, the electrical energy producer comprises an electrical generator, wherein the step of activating any one of an electrical energy consumer and an electrical energy producer included in the first electrical circuit comprises activating the electrical generator to charge the first electric battery unit. An advantage of this embodiment is that a further improved procedure for associating a sensor device with an electric battery unit of a plurality of electric battery units is provided.

According to an advantageous embodiment of the method according to the first aspect, the plurality of electric battery units comprises or consists of a plurality of lead-acid battery units. Embodiments of the innovative method according to the first aspect are indeed advantageous for lead-acid batteries. An advantage of this embodiment is that a further improved procedure for associating a sensor device with an electric battery unit of a plurality of electric battery units is provided.

According to a further advantageous embodiment of the method according to the first aspect, the method comprises:

keeping any one of an electrical energy consumer and an electrical energy producer included in the second electrical circuit inactive.

An advantage of this embodiment is that a further improved procedure for associating a sensor device with an electric battery unit of a plurality of electric battery units is provided.

According to another advantageous embodiment of the method according to the first aspect, the method comprises:

keeping every one of an electrical energy consumer and an electrical energy producer included in the second electrical circuit inactive.

An advantage of this embodiment is that a further improved procedure for associating a sensor device with an electric battery unit of a plurality of electric battery units is provided.

According to a second aspect of the invention, the above mentioned and other objects are achieved with a computer program comprising instructions which, when the program is executed by a computer, cause the computer to carry out the method according to any one of the embodiments disclosed above or below. The advantages of the computer program according to the second aspect correspond to the above- or below-mentioned advantages of the method according to the first aspect and its embodiments.

According to a third aspect of the invention, the above mentioned and other objects are achieved with a computer-readable medium comprising instructions which, when the instructions are executed by a computer, cause the computer to carry out the method according to any one of the embodiments disclosed above or below. The advantages of the computer-readable medium according to the third aspect correspond to the above- or below-mentioned advantages of the method according to the first aspect and its embodiments.

According to an aspect of the present invention, the above-mentioned computer program and/or the computer-readable medium are/is configured to implement the method and its embodiments described herein.

According to a fourth aspect of the invention, the above mentioned and other objects are achieved with a control arrangement for determining the association of a sensor device with an electric battery unit of a plurality of electric battery units, wherein the plurality of electric battery units is connected to an electrical arrangement, wherein the electrical arrangement comprises a first electrical circuit comprising a first electric battery unit of the plurality of electric battery units, wherein the electrical arrangement comprises a second electrical circuit comprising a second electric battery unit of the plurality of electric battery units, wherein the electrical arrangement comprises an electric current limiting device connecting the first electrical circuit to the second electrical circuit, and wherein a first sensor device is connected to detect any one of a voltage and an electric current associated with one of the first and second electric battery units while a second sensor device is connected to detect any one of a voltage and an electric current associated with the other one of the first and second electric battery units, wherein the control arrangement is configured to:

activate any one of an electrical energy consumer and an electrical energy producer included in the first electrical circuit, and upon detection of any one of a voltage change and an electric current change by one of the first and second sensor devices, determine that the one of the first and second sensor devices which detects any one of a voltage change and an electric current change is associated with the first electric battery unit of the first electrical circuit.

The advantages of the control arrangement according to the fourth aspect correspond to the above- or below-mentioned advantages of the method according to the first aspect and its embodiments.

It is to be appreciated that all the embodiments described for the method aspects of the invention are applicable also to the control arrangement aspects of the invention. Thus, all embodiments described for the method aspects of the invention may be performed by the control arrangement, which may include one or more control units, or one or more control devices. As mentioned above, the control arrangement and its embodiments have advantages corresponding to the advantages mentioned above for the method and its embodiments.

According to a fifth aspect of the invention, the above mentioned and other objects are achieved with a vehicle comprising a control arrangement according to any one of the embodiments disclosed above or below.

The advantages of the vehicle according to the fifth aspect correspond to the above- or below-mentioned advantages of the method according to the first aspect and its embodiments.

The vehicle may be a wheeled vehicle, i.e. a vehicle having wheels. The vehicle may for example be a bus, a tractor vehicle, a heavy vehicle, a truck, or a car. The tractor vehicle, and/or the truck, may, or may be configured to, haul, or pull, a trailer. However, other types of vehicles are possible. The vehicle may be referred to as a motor vehicle. The vehicle may be an electric vehicle, EV, for example a hybrid vehicle or a hybrid electric vehicle, HEV, or a battery electric vehicle, BEV. Thus, a hybrid electric vehicle, HEV, and a battery electric vehicle, BEV, are versions, or examples, of an electric vehicle, EV. The EV may comprise one or more electric motors or electrical machines. The vehicle may comprise a combustion engine.

The vehicle may comprise a powertrain. The powertrain may be configured in accordance with any one of the embodiments disclosed above or below. The vehicle may comprise one or more of the group of: an electric battery; and an electric battery pack. The powertrain of the vehicle may comprise one or more of the group of: a combustion engine; an electric battery; and an electric battery pack.

The above-mentioned features and embodiments of the method, the computer program, the computer-readable medium, the control arrangement and the vehicle, respectively, may be combined in various possible ways providing further advantageous embodiments.

Further advantageous embodiments of the method, the computer program, the computer-readable medium, the control arrangement and the vehicle according to the present invention and further advantages with the embodiments of the present invention emerge from the detailed description of embodiments.

BRIEF DESCRIPTION OF THE DRAWINGS

Embodiments of the invention will now be illustrated, for exemplary purposes, in more detail by way of embodiments and with reference to the enclosed drawings, where similar references are used for similar parts, in which.

DETAILED DESCRIPTION

With reference to FIGS. 1 to 4, four examples of an electrical arrangement 100, 200, 300, 400, to which embodiments of the method according to the first aspect of the invention can be applied, are schematically illustrated. It is to be understood that one or more additional electrical components, electrical circuits, electrical devices and/or electrical systems may be added or connected, such as electrically connected, to the electrical arrangements 100, 200, 300, 400 which are illustrated. Further, the items of the respective electrical arrangement 100, 200, 300, 400 may be arranged and/or connected, such as electrically connected, in various other possible ways different from the illustrations in FIGS. 1 to 4.

Figure 1:
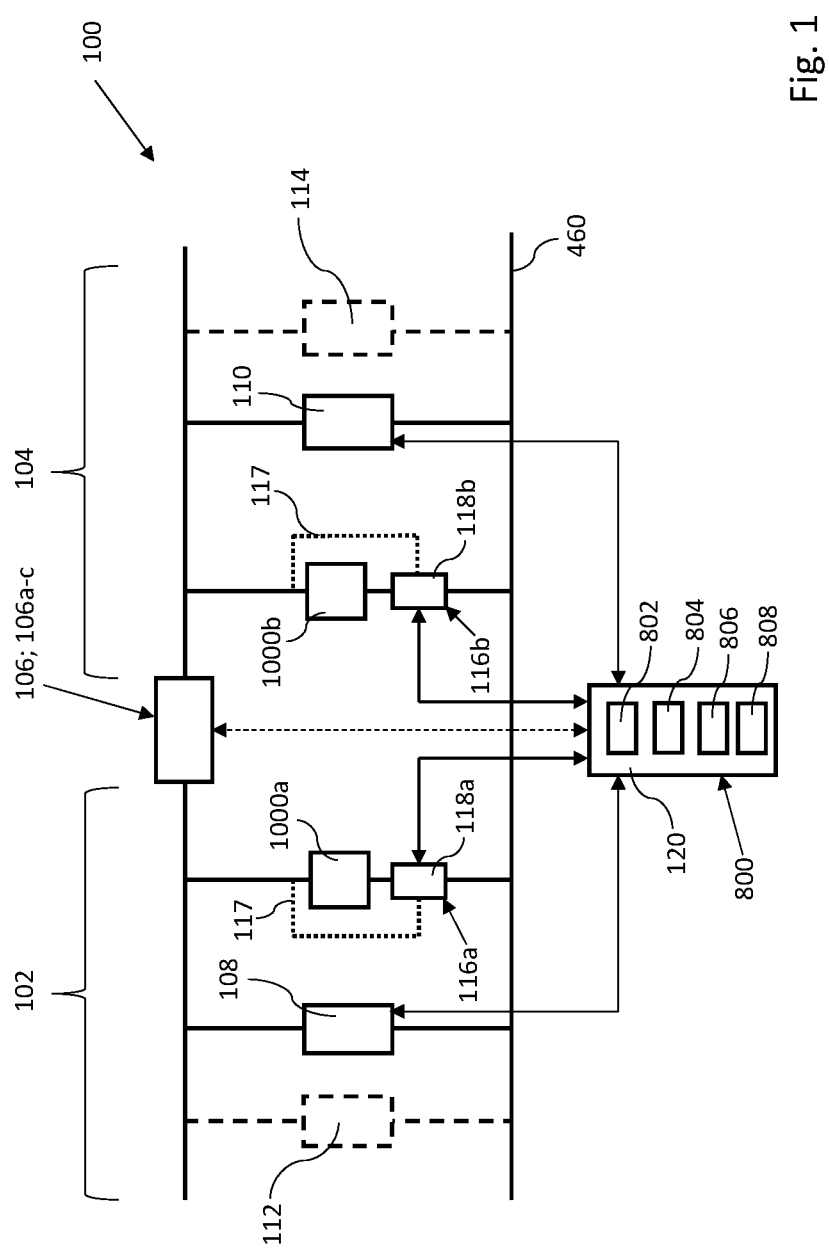
FIG. 1 is a schematic diagram of a first example of an electrical arrangement to which embodiments of the method according to the first aspect can be applied.

With reference to FIG. 1, the electrical arrangement 100 includes a first electrical circuit 102 and a second electrical circuit 104. The first electrical circuit 102 includes a first electric battery unit 1000a of a plurality of electric battery units 1000a, 1000b. The second electrical circuit 104 includes a second electric battery unit 1000b of the plurality of electric battery units 1000a, 1000b. Each of the first and second electric battery unit 1000a, 1000b may comprise one or more electric batteries. An example of an electric battery unit 1000a, 1000b, 1000 is disclosed in further detail hereinbelow in connection with FIG. 12. Each of the first and second electric battery unit 1000a, 1000b may comprise a 12 volts battery. Each of the first and second electric battery unit 1000a, 1000b may comprise two or more 12 volts batteries, for example electrically connected in series or in parallel. However, other voltage levels are possible. For example, each of the first and second electric battery unit 1000a, 1000b may be configured to provide a voltage of 6, 12, 24 or 48 V. In some cases or for some embodiments, the plurality of electric battery units 1000a, 1000b may comprise or consist of a plurality of lead-acid battery units. Each of the above-mentioned one or more electric batteries may comprise a lead-acid battery. However, in some examples or for some embodiments, each of the above-mentioned one or more electric batteries may comprise any one of a lithium-ion (Li-ion) battery and a NiMH battery. However, other electric batteries are possible.

With reference to FIG. 1, it may be defined that the plurality of electric battery units 1000a, 1000b is connected to the electrical arrangement 100. It may be defined that the plurality of electric battery units 1000a, 1000b is electrically connected to the electrical arrangement 100. It may be defined that the plurality of electric battery units 1000a, 1000b is included in the electrical arrangement 100.

For example, the first and second electrical circuits 102, 104 may be included in an electrical arrangement including two or more parallel electrical systems, which for example may be the case for autonomous vehicles, wherein one of the parallel electrical systems can still function and operate the vehicle although the other one of the parallel electrical systems fails or malfunctions, wherein redundancy is provided.

However, two or more parallel electrical systems may also be used in other vehicles, for example for safety reasons, where critical functionalities may be included in different electrical systems of the two or more parallel electrical systems. For example, the electric power supply circuit of the steering system of a vehicle 700 (see FIG. 10) may be included in one 102, 104 of the first and second electrical circuits 102, 104, or in one of the parallel electrical systems, while the electric power supply circuit of the braking system of the vehicle 700 may be included in the other one 102, 104 of the first and second electrical circuits 102, 104, or in the other one of the parallel electrical systems.

With reference to FIG. 1, the electrical arrangement 100 includes an electric current limiting device 106. The electric current limiting device 106 connects the first electrical circuit 102 to the second electrical circuit 104. It is to be understood that the electric current limiting device 106 is configured to limit the electric current, for example limit the current between the first and second electrical circuits 102, 104. The electric current limiting device 106 may be referred to as an electric current restricting device. It may be defined that the electric current limiting device 106 is configured to electrically connect the first electrical circuit 102 to the second electrical circuit 104. Versions of the electric current limiting device 106 are disclosed in further detailed hereinbelow in connection with FIGS. 5 to 7. It may be defined that the first electrical circuit 102 and the second electrical circuit 104 are connected to one another via the electric current limiting device 106.

With reference to FIG. 1, in the illustrated example, each of the first and second electrical circuits 102, 104 includes an electrical energy consumer 108, 110. The electrical energy consumer 108, 110 may be any kind of electrical unit, circuit, apparatus, component, device or system consuming electrical energy, for example one or more of a group of: an electric motor; a control system, such as an electronic control unit, ECU. However, other types of electrical energy consumers 108, 110 are possible. The electrical energy consumer 108, 110 may be described to be connected to the electrical arrangement 100. The electrical energy consumer 108 of the first electrical circuit 102 may be described to be connected to the first electrical circuit 102. The electrical energy consumer 108 of the first electrical circuit 102 may be described to be electrically connected to the first electrical circuit 102. The electrical energy consumer 110 of the second electrical circuit 104 may be described to be connected to the second electrical circuit 104. The electrical energy consumer 110 of the second electrical circuit 104 may be described to be electrically connected to the second electrical circuit 104.

With reference to FIG. 1, the electrical energy consumer 108, 110 may be described to be switchable between an inactive state and an active state, wherein the active state may be the state in which the electrical energy consumer 108, 110 consumes electrical energy. The electrical energy consumer 108, 110 may be described be turned on or switched on when being in the active state. The electrical energy consumer 108, 110 may be described be turned off or switched off when being in the inactive state. It is to be understood that each of the first and second electrical circuits 102, 104 may include one or more additional electrical energy consumers 112, 114. Each of the above- or below-mentioned electrical energy consumers 108, 110, 112, 114 may be defined as an electrical load.

With reference to FIG. 1, the first electric battery unit 1000a of the first electrical circuit 102 may be connected, such as electrically connected, in parallel with the electrical energy consumer 108 of the first electrical circuit 102. The second electric battery unit 1000b of the second electrical circuit 104 may be connected, such as electrically connected, in parallel with the electrical energy consumer 110 of the second electrical circuit 104. However, other configurations are possible.

As illustrated in FIG. 1, a first sensor device 116a is connected to detect any one of a voltage and an electric current (i.e. a voltage or an electric current) associated with one 1000a, 1000b of the first and second electric battery units 1000a, 1000b, for example to measure any one of a voltage and an electric current, while a second sensor device 116b is connected to detect any one of a voltage and an electric current associated with the other one 1000a, 1000b of the first and second electric battery units 1000a, 1000b, for example to measure any one of a voltage and an electric current. More specifically, the first sensor device 116a may be connected to detect any one of a voltage change and an electric current change (i.e. a voltage change or an electric current change) associated with one 1000a, 1000b of the first and second electric battery units 1000a, 1000b while the second sensor device 116b may be connected to detect any one of a voltage change and an electric current change associated with the other one 1000a, 1000b of the first and second electric battery units 1000a, 1000b. Each of the first and second sensor devices 116a, 116b may be connected to a control arrangement 800, for example implemented in or as, or included in, an electronic control unit, ECU, 120 of a vehicle 700 (see FIG. 10). However, the control arrangement

800 may be associated with other systems or apparatuses different from a vehicle. Each of the first and second sensor devices 116a, 116b may comprise or consist of one or more sensors 118a, 118b. The sensor device 116a, 116b may comprise or consist of one or more electric battery unit sensors. The sensor device 116a, 116b may comprise or consist of one or more electric battery sensors. The electric battery sensor may be referred to as a battery diagnostic module, BDM.

With reference to FIG. 1, each of the first and second sensor devices 116a, 116b may be configured to detect a voltage and/or an electric current associated with one 1000a, 1000b of the first and second electric battery units 1000a, 1000b and/or a voltage change and/or an electric current change associated with one 1000a, 1000b of the first and second electric battery units 1000a, 1000b. Further, for some embodiments, in addition to a voltage and an electric current associated with one 1000a, 1000b of the first and second electric battery units 1000a, 1000b, each of the first and second sensor devices 116a, 116b may be configured to detect a temperature associated with one 1000a, 1000b of the first and second electric battery units 1000a, 1000b, for example a terminal temperature associated with one 1000a, 1000b of the first and second electric battery units 1000a, 1000b. However, each of the first and second sensor devices 116a, 116b may be configured to detect other physical quantities associated with one 1000a, 1000b of the first and second electric battery units 1000a, 1000b. Based on one or more of the voltage and the electric current associated with one 1000a, 1000b of the first and second electric battery units 1000a, 1000b, the first or second sensor device 116a, 116b, the control arrangement 800 or the ECU 120 may be configured to determine and/calculate the state of charge (SoC) and the state of health (SoH) associated with said one electric battery unit 1000a, 1000b of the first and second electric battery units 1000a, 1000b. Further data and/or information associated with the first and second electric battery units 1000a, 1000b may be provided by way of the first and second sensor devices 116a, 116b, the control arrangement 800 and/or the ECU 120.

With reference to FIG. 1, one 116a, 116b of the first and second sensor devices 116a, 116b may be connected to one 1000a, 1000b of the first and second electric battery units 1000a, 1000b while the other one 116a, 116b of the first and second sensor devices 116a, 116b may be connected to the other one 1000a, 1000b of the first and second electric battery units 1000a, 1000b, for example to one or more of the terminals or poles of the respective electric battery unit 1000a, 1000b. For example, one 116a, 116b of the first and second sensor devices 116a, 116b may be connected, and also optionally mounted, to a negative pole of one 1000a, 1000b of the first and second electric battery unit 1000a, 1000b, and one or more voltage sensing conductors 117 may connect the one 116a, 116b of the first and second sensor devices 116a, 116b to a positive pole of the one 1000a, 1000b of the first and second electric battery unit 1000a, 1000b, or the other way around. In a corresponding manner, the other one 116a, 116b of the first and second sensor devices 116a, 116b may be connected, and also optionally mounted, to a negative pole of the other one 1000a, 1000b of the first and second electric battery unit 1000a, 1000b, and one or more voltage sensing conductors 117 may connect the other one 116a, 116b of the first and second sensor devices 116a, 116b to a positive pole of the other one 1000a, 1000b of the first and second electric battery unit 1000a, 1000b, or the other way around. However, other connection configurations of the first and second sensor devices 116a, 116b are possible. Each of the first and second sensor devices 116a, 116b may be provided with electrical energy for its operation from the electric battery unit 1000a, 1000b to which it is connected, for example with the assistance of the one or more voltage sensing conductors 117. However, the first and second sensor devices 116a, 116b may be provided with electrical energy for its operation from any other external electrical energy source or supply.

The physical structure or configuration of the first sensor device 116a may be identical to the physical structure or configuration of the second sensor device 116b, i.e. the hardware of the first sensor device 116a may be substantially identical to the hardware of the second sensor device 116b. The first and second sensor devices 116a, 116b may have different software identities, for example different message-based communication identities, such as different CAN identities or MOST identities. The different software identities of first and second sensor devices 116a, 116b may be read and/or processed by the control arrangement 800 and/or the ECU 120.

The electrical arrangement 100 may include one or more additional electrical circuits. For example, each additional electrical circuit may include an electric battery unit of the plurality of electric battery units. Further, each additional electrical circuit may include one or more of the group of: an electrical energy consumer; and an electrical energy producer. The electrical energy consumer of each additional electrical circuit and the electrical energy producer of each additional electrical circuit may correspond to any one of the different electrical energy consumers and electrical energy producers disclosed above or below.

Figure 2:
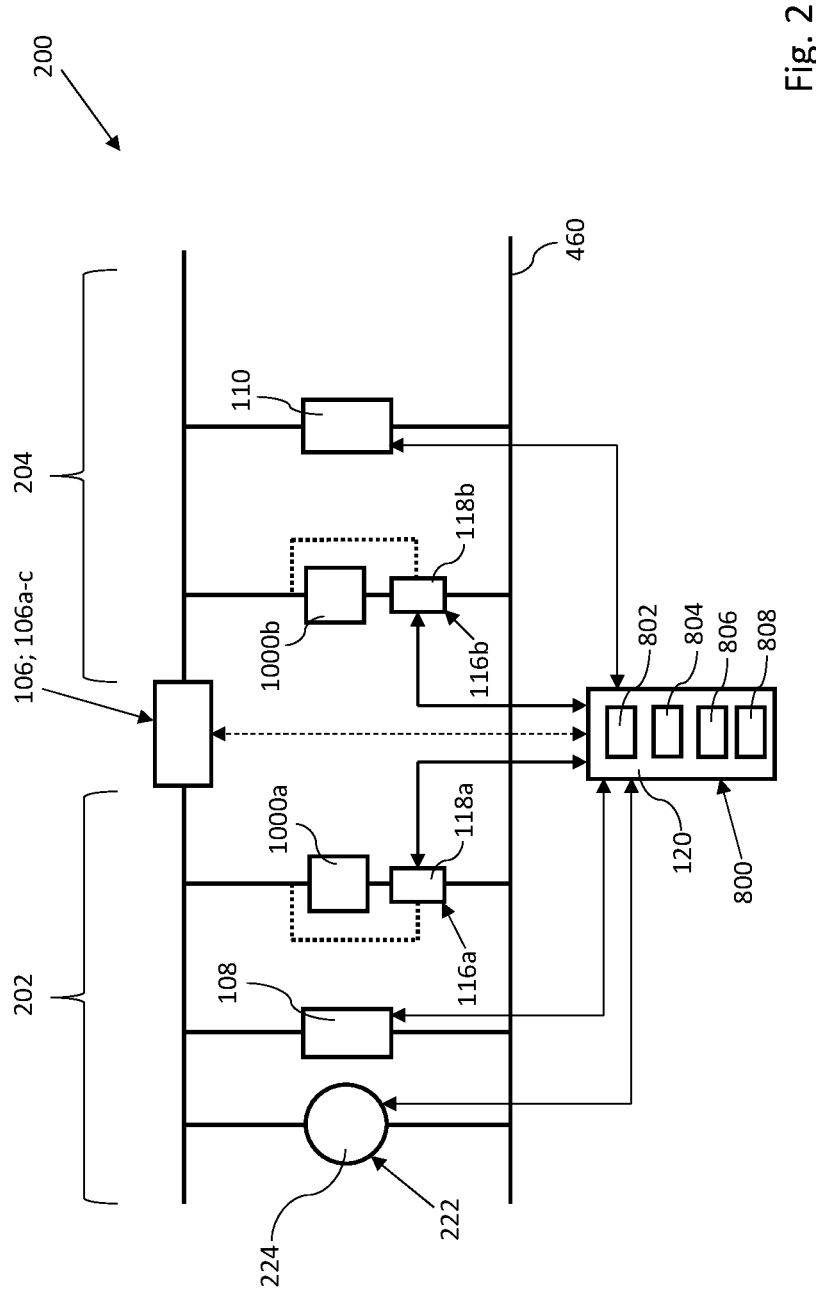
FIG. 2 is a schematic diagram of a second example of an electrical arrangement to which embodiments of the method according to the first aspect can be applied.

With reference to FIG. 2, a second example of an electrical arrangement 200, to which embodiments of the method according to the first aspect can be applied, is schematically illustrated. Several items of the second example of the electrical arrangement 200 correspond to items of the first example of the electrical arrangement 100 disclosed above in connection with FIG. 1 and are thus not repeated here. In addition to the items which the second example of the electrical arrangement 200 has in common with the first example of the electrical arrangement 100, the first electrical circuit 202 of the electrical arrangement 200 in FIG. 2 includes an electrical energy producer 222. The electrical energy producer 222 may be any kind of electrical unit, circuit, apparatus, component, device or system producing electrical energy, for example one or more of a group of: an electrical generator 224; an electric power converter, for example a DC-to-DC converter; and a fuel cell. However, other types of electrical energy producers are also possible. The electrical energy producer 222 may be described to be connected to the electrical arrangement 200. The electrical energy producer 222 of the first electrical circuit 202 may be described to be connected to the first electrical circuit 202. The electrical energy producer 222 of the first electrical circuit 202 may be described to be electrically connected to the first electrical circuit 202.

With reference to FIG. 2, the electrical energy producer 222 may be described to be switchable between an inactive state and an active state, wherein the active state may be the state in which the electrical energy producer 222 produces electrical energy. The electrical energy producer 222 may be described be turned on or switched on when being in the active state. The electrical energy producer 222 may be described be turned off or switched off when being in the inactive state. It is to be understood that the first electrical circuit 202 may include one or more additional electrical energy producers. The electrical energy producer 222 may be connected, such as electrically connected, in parallel with the first electric battery unit 1000a of the first electrical circuit 202. The electrical energy producer 222 may be connected, such as electrically connected, in parallel with the electrical energy consumer 108 of the first electrical circuit 202. However, other configurations are possible.

Otherwise, the electrical arrangement 200 in FIG. 2 may correspond to the electrical arrangement 100 in FIG. 1. Thus, the first electrical circuit 202 of the electrical arrangement 200 in FIG. 2 may correspond to the first electrical circuit 102 of the electrical arrangement 100 in FIG. 1, while the second electrical circuit 204 of the electrical arrangement 200 in FIG. 2 may correspond to the second electrical circuit 104 of the electrical arrangement 100 in FIG. 1.

Figure 3:
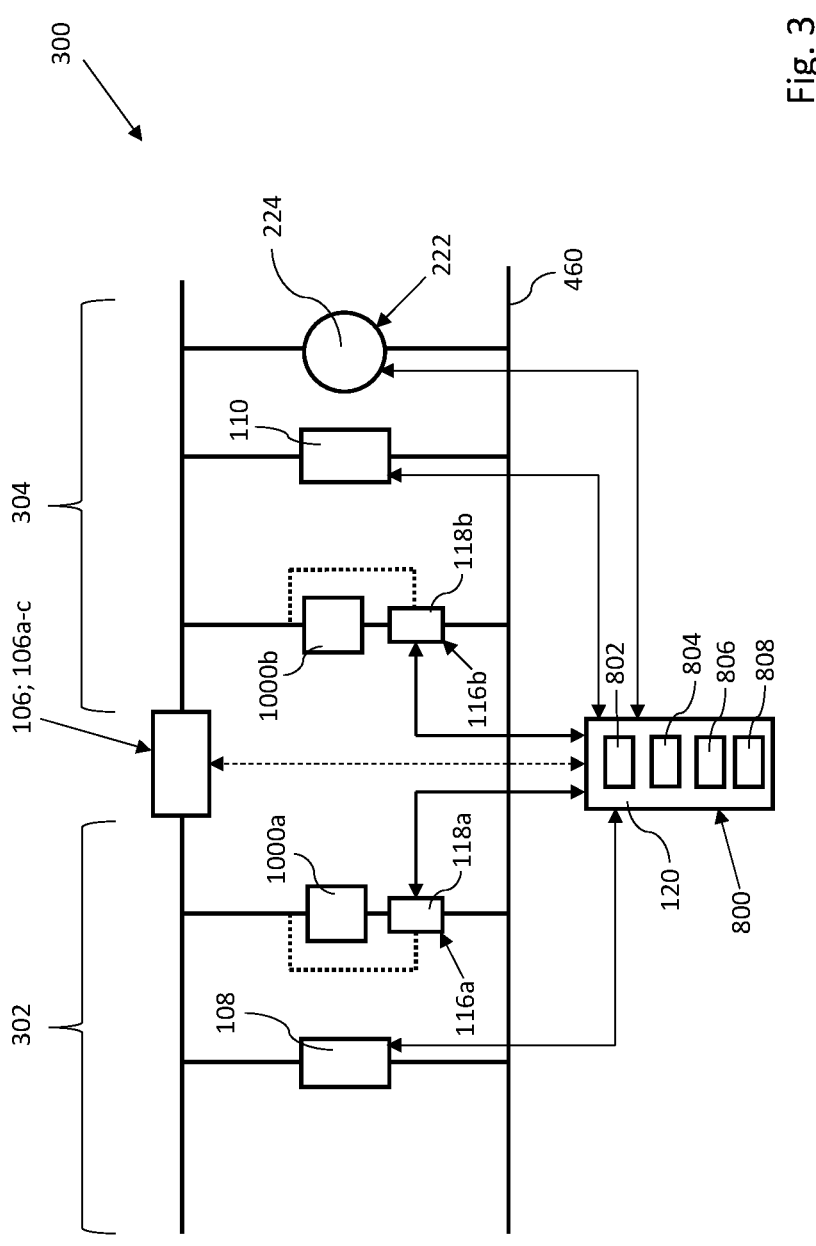
FIG. 3 is a schematic diagram of a third example of an electrical arrangement to which embodiments of the method according to the first aspect can be applied.

With reference to FIG. 3, a third example of an electrical arrangement 300, to which embodiments of the method according to the first aspect can be applied, is schematically illustrated. Several items of the third example of the electrical arrangement 300 correspond to items of the first example of the electrical arrangement 100 disclosed above in connection with FIG. 1 and are thus not repeated here. In addition to the items which the third example of the electrical arrangement 300 has in common with the first example of the electrical arrangement 100, the second electrical circuit 304 of the electrical arrangement 300 in FIG. 3 includes an electrical energy producer 222. The electrical energy producer 222 of the electrical arrangement 300 of FIG. 3 may substantially correspond to the electrical energy producer 222 of the electrical arrangement 200 of FIG. 2. The electrical energy producer 222 of the second electrical circuit 304 of the electrical arrangement 300 of FIG. 3 may be described to be connected to the second electrical circuit 304. The electrical energy producer 222 of the second electrical circuit 304 of the electrical arrangement 300 of FIG. 3 may be described to be electrically connected to the second electrical circuit 304.

With reference to FIG. 3, it is to be understood that the second electrical circuit 304 of the electrical arrangement 300 of FIG. 3 may include one or more additional electrical energy producers. The electrical energy producer 222 of the electrical arrangement 300 of FIG. 3 may be connected in parallel, such as electrically connected, with the second electric battery unit 1000b of the second electrical circuit 304. The electrical energy producer 222 of the electrical arrangement 300 of FIG. 3 may be connected, such as electrically connected, in parallel with the electrical energy consumer 110 of the second electrical circuit 304. However, other configurations are possible.

Otherwise, the electrical arrangement 300 in FIG. 3 may correspond to the electrical arrangement 100 in FIG. 1. Thus, the first electrical circuit 302 of the electrical arrangement 300 in FIG. 3 may correspond to the first electrical circuit 102 of the electrical arrangement 100 in FIG. 1, while the second electrical circuit 304 of the electrical arrangement 300 in FIG. 3 may correspond to the second electrical circuit 104 of the electrical arrangement 100 in FIG. 1.

Figure 4:
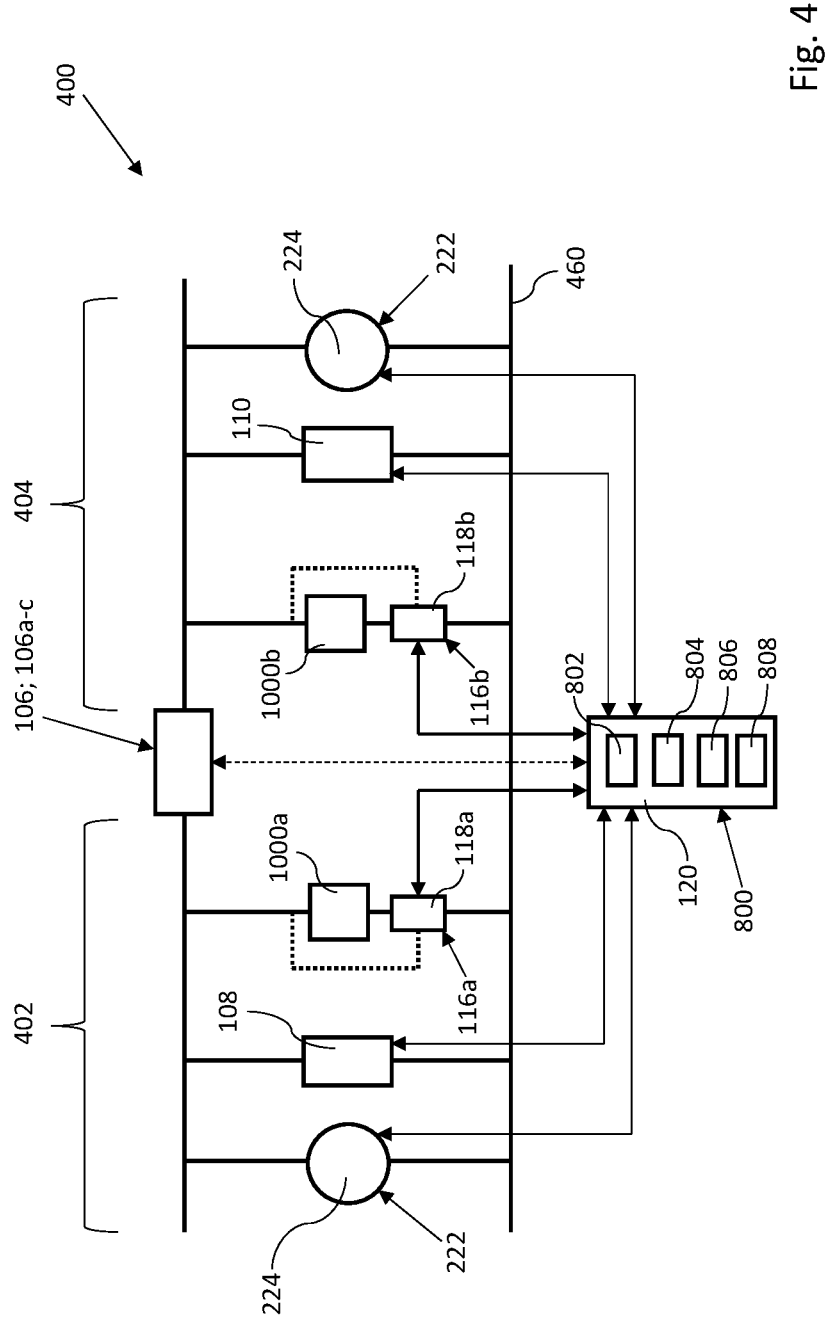
FIG. 4 is a schematic diagram of a fourth example of an electrical arrangement to which embodiments of the method according to the first aspect can be applied.

With reference to FIG. 4, a fourth example of an electrical arrangement 400, to which embodiments of the method according to the first aspect can be applied, is schematically illustrated. Several items of the fourth example of the electrical arrangement 400 correspond to items of the first, second and third examples of the electrical arrangement 100, 200, 300 disclosed above in connection with FIGS. 1-3 and are thus not repeated here. In relation to the second and third examples of the electrical arrangement 200, 300 in FIGS. 2 and 3, each of the first and second electrical circuits 402, 404 of the electrical arrangement 400 in FIG. 4 includes an electrical energy producer 222. Each of the electrical energy producers 222 of the electrical arrangement 400 of FIG. 4 may substantially correspond to the electrical energy producers 222 of the electrical arrangements 200, 300 of FIGS. 2 and 3.

With reference to FIG. 4, the electrical energy producer 222 of the first electrical circuit 402 of the electrical arrangement 400 of FIG. 4 may be described to be connected to the first electrical circuit 402. The electrical energy producer 222 of the first electrical circuit 402 of the electrical arrangement 400 of FIG. 4 may be described to be electrically connected to the first electrical circuit 402. The electrical energy producer 222 of the second electrical circuit 404 of the electrical arrangement 400 of FIG. 4 may be described to be connected to the second electrical circuit 404. The electrical energy producer 222 of the second electrical circuit 404 of the electrical arrangement 400 of FIG. 4 may be described to be electrically connected to the second electrical circuit 404.

With reference to FIG. 4, the electrical energy producer 222 of the first electrical circuit 402 of the electrical arrangement 400 of FIG. 4 may be connected, such as electrically connected, in parallel with the first electric battery unit 1000a of the first electrical circuit 402. The electrical energy producer 222 of the first electrical circuit 402 of the electrical arrangement 400 of FIG. 4 may be connected, such as electrically connected, in parallel with the electrical energy consumer 108 of the first electrical circuit 402. The electrical energy producer 222 of the second electrical circuit 404 of the electrical arrangement 400 of FIG. 4 may be connected, such as electrically connected, in parallel with the second electric battery unit 1000b of the second electrical circuit 404. The electrical energy producer 222 of the second electrical circuit 404 of the electrical arrangement 400 of FIG. 4 may be connected, such as electrically connected, in parallel with the electrical energy consumer 110 of the second electrical circuit 304. However, other configurations are possible.

Otherwise, the electrical arrangement 400 in FIG. 4 may correspond to one or more of the electrical arrangements 100, 200, 300 in FIGS. 1, 2 and 3. Thus, the first electrical circuit 402 of the electrical arrangement 400 in FIG. 4 may correspond to the first electrical circuit 202 of the electrical arrangement 200 in FIG. 2, while the second electrical circuit 404 of the electrical arrangement 400 in FIG. 4 may correspond to the second electrical circuit 304 of the electrical arrangement 300 in FIG. 3.

Figure 6:
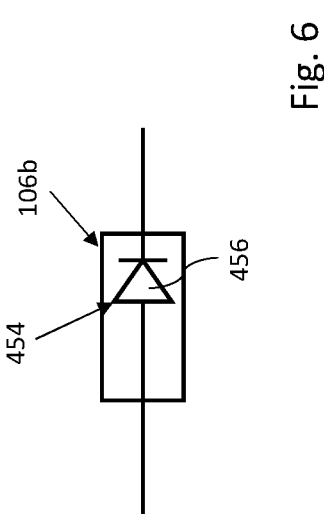
FIG. 6 is a schematic diagram of a second example of an electric current limiting which may be included in any one of the first to fourth examples of an electrical arrangement.
Figure 7:
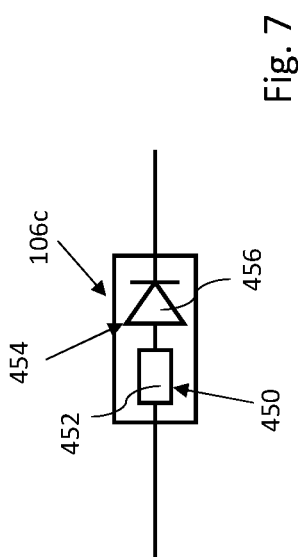
FIG. 7 is a schematic diagram of a third example of an electric current limiting which may be included in any one of the first to fourth examples of an electrical arrangement.
Figure 5:
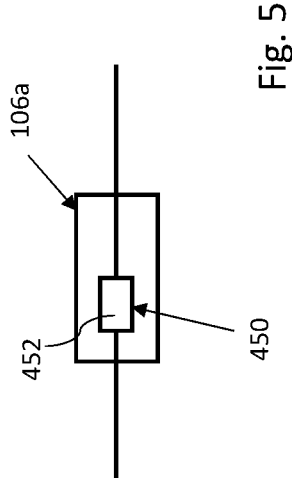
FIG. 5 is a schematic diagram of a first example of an electric current limiting which may be included in any one of the first to fourth examples of an electrical arrangement.

With reference to FIGS. 5-7, versions 106a, 106b, 106c of the electric current limiting device 106, 106a, 106b, 106c are schematically illustrated. With reference to FIG. 5, the electric current limiting device 106a may include a switching device 450 switchable between a non-conducting state and a conducting state. The non-conducting state may be defined as an open state or position, and the conducting state may be defined as a closed state or position. When the switching device 450 is in the conducting state the switching device 450 is configured to allow an electric current to pass. When the switching device 450 is in the non-conducting state the switching device 450 is configured to interrupt an electric current. The switching device 450 can be described to be an electrical switching device, for example an electrically operable or controllable switching device, which optionally may include a mechanical switch. The switching device 450 may comprise or consist of an electric battery master switch, BMS, 452. The switching device 450 may comprise or consist of a semiconductor switch, for example an IGBT switch or a MOSFET switch. However, other switches are possible.

With reference to FIG. 6, the electric current limiting device 106b may include an electrical one-way conducting device 454 configured to conduct electric current in one direction only. The electrical one-way conducting device 454 may include or consist of a diode 456, for example a semiconductor diode 456.

With reference to FIG. 7, the electric current limiting device 106c may include both a switching device 450, for example as disclosed above in connection with FIG. 5, and an electrical one-way conducting device 454, for example as disclosed above in connection with FIG. 6.

With reference to FIGS. 1 to 4, the various parts 102, 202, 302, 402, 104, 204, 304, 404, 106, 108, 110, 112, 114, 116a-b, 118a-b, 222, 224 of the electrical arrangements 100, 200, 300, 400 and the control arrangement 800 illustrated above may be connected to one another, such as electrically connected to one another, via electrical conductors 460, such electrical cables, electrical lines, busbars, or other electrical conductors 460, and/or in some cases, wirelessly connected to one another.

In some embodiments, it is to be understood that the electrical circuit 104, 204, 304, 404 to the right of the electric current limiting device 106 in FIGS. 1-4 may instead be referred to as the first circuit 104, 204, 304, 404 of the electrical arrangement 100, 200, 300, 400 while that the electrical circuit 102, 202, 302, 402 to the left of the electric current limiting device 106 in FIGS. 1-4 may instead be referred to as the second circuit 102, 202, 302, 402 of the electrical arrangement 100, 200, 300, 400.

Figure 8:
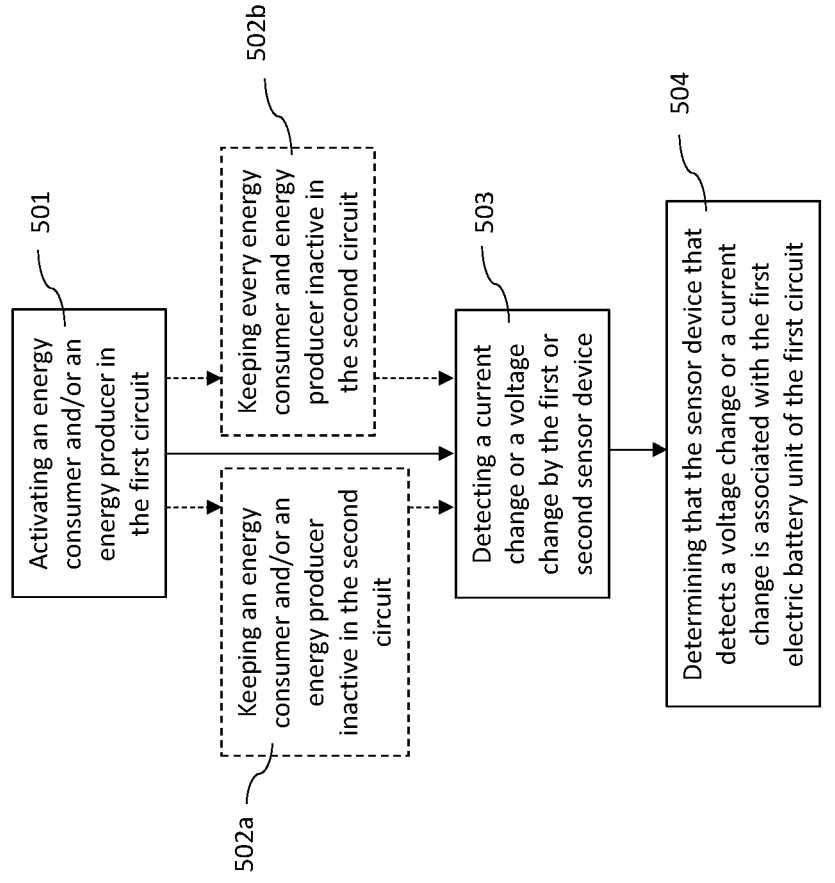
FIG. 8 is a schematic flow chart illustrating aspects of embodiments of the method according to the first aspect of the invention.
Figure 9:
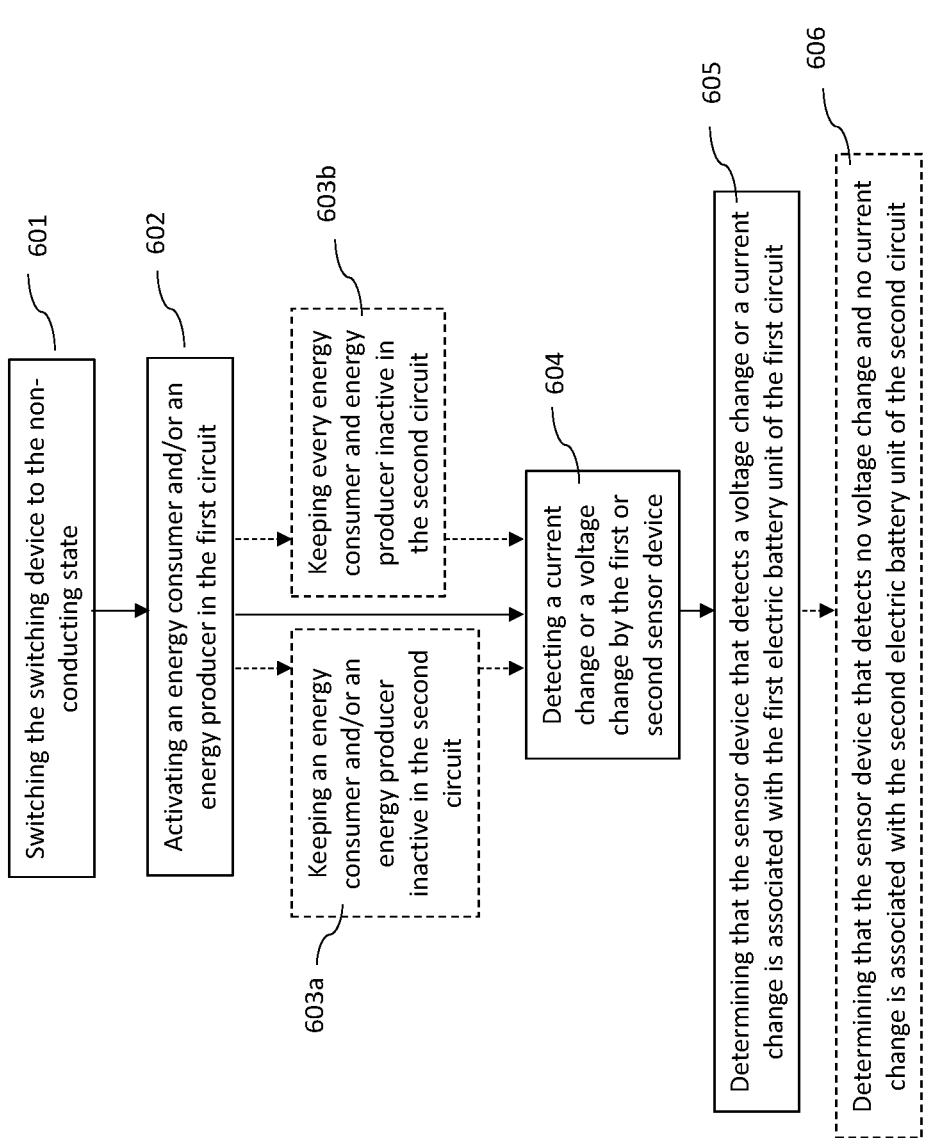
FIG. 9 is another schematic flow chart illustrating aspects of embodiments of the method according to the first aspect of the invention.

With reference to FIGS. 8 and 9, aspects of embodiments of the method for determining the association of a sensor device 116a, 116b with an electric battery unit 1000a, 1000b of a plurality of electric battery units 1000a, 1000b according to the first aspect are schematically illustrated.

With reference to FIG. 8, when a first sensor device 116a has been connected to detect any one of a voltage (or a voltage change) and an electric current (or an electric current change) associated with one 1000a, 1000b of the first and second electric battery units 1000a, 1000b while a second sensor device 116b has been connected to detect any one of a voltage (or a voltage change) and an electric current (or an electric current change) associated with the other one 1000a, 1000b of the first and second electric battery units 1000a, 1000b, wherein the first and second electric battery units 1000a, 1000b may be included in any one of the electrical arrangements 100, 200, 300, 400 disclosed above, but it is unknown, for example, to an operator or a user, or a control arrangement 800, or an ECU 120, connected to the first and second sensor devices 116a, 116b, which one 116a, 116b of the first and second sensor devices 116a, 116b has been coupled to monitor which one 1000a, 1000b of the first and second electric battery units 1000a, 1000b, embodiments of the method attains information in this regard by including the steps of (for example, when an electric current limiting device 106, 106b, which includes an electrical one-way conducting device 454, as illustrated in FIG. 6 is applied to the electrical arrangements 100, 200, 300, 400 disclosed above):

activating 501 any one 108, 222 of an electrical energy consumer 108 and an electrical energy producer 222 (i.e., an electrical energy consumer 108 or an electrical energy producer 222) included in the first electrical circuit 102, 202, 302, 402; and upon detection of any one of a voltage change and an electric current change (i.e. a voltage change or an electric current change) by one of the first and second sensor devices 116a, 116b, determining 504 that the one 116a of the first and second sensor devices 116a, 116b which detects any one of a voltage change and an electric current change is associated with the first electric battery unit 1000a of the first electrical circuit 102, 202, 302, 402.

It is to be understood that in some embodiments, the electrical energy consumer 108, 110, which may be activated 501 according to embodiments of the method according to the first aspect, is included in the first electrical circuit 102, 202, 302, 402.

With reference to FIG. 8, the step of activating 501 any one 108, 222 of an electrical energy consumer 108 and an electrical energy producer 222 included in the first electrical circuit 102, 202, 302, 402 may comprise any one of the step of activating 501 the electrical energy consumer 108 included in the first electrical circuit 102, 202, 302, 402 to consume electrical energy and the step of activating 501 the electrical energy producer 222 included in the first electrical circuit 102, 202, 302, 402 to produce electrical energy.

With reference to FIG. 8, for some embodiments, the step of activating 501 any one 108, 222 of an electrical energy consumer 108 and an electrical energy producer 222 included in the first electrical circuit 102, 2092, 302, 402 includes activating 501 the electrical energy consumer 108 to consume electrical energy, whereupon an electric current is supplied from the first electric battery unit 1000a and detected by one 116a, 116b of the first and second sensor devices 116a, 116b.

With reference to FIG. 8, for some embodiments, the step of activating 501 any one 108, 222 of an electrical energy consumer 108 and an electrical energy producer 222 included in the first electrical circuit 102, 202, 302, 402 includes activating 501 the electrical energy producer 222 to produce electrical energy, whereupon the first electric battery unit 1000a is charged, and wherein the charging of the first electric battery unit 1000a is detected by one 116a, 116b of the first and second sensor devices 116a, 116b. With reference to FIGS. 2 and 4, for some embodiments, the electrical energy producer 222 may include an electrical generator 224, wherein the step of activating 501 any one 108, 222 of an electrical energy consumer 108 and an electrical energy producer 222 included in the first electrical circuit 102, 202, 302, 402 comprises activating 501 the electrical generator 224 to charge the first electric battery unit 1000a.

By way of embodiments of the method, it can be assured, for example by the control arrangement 800 or the ECU 120, which one 116a, 116b of the first and second sensor devices 116a, 116b is monitoring a specific electric battery unit 1000a, 1000b such as the first electric battery unit 1000a of the first electrical circuit 102, 202, 302, 402. Expressed alternatively, it can be identified (or distinguished or singled out) which one 116a, 116b of the first and second sensor devices 116a, 116b is monitoring a specific electric battery unit 1000a, 1000b. The risk of mixing up the data from the first and second electric battery units 1000a, 1000b, for example in the control arrangement 800 or the ECU 120, because of the lack of information about which one 116a, 116b of the first and second sensor devices 116a, 116b is associated with which one 1000a, 1000b of the first and second electric battery units 1000a, 1000b, is minimized and safety is assured. Thus, the risk or running out of electrical energy with regard to one 1000a, 1000b of the first and second electric battery units 1000a, 1000b because the sensor device 116a, 116b in fact is monitoring the other one 1000a, 1000b of the first and second electric battery units 1000a, 1000b is minimized.

With reference to FIG. 8, embodiments of the method according to the first aspect may include the step of:

keeping 502a any one 110, 222 of an electrical energy consumer 110 and an electrical energy producer 222 included in the second electrical circuit 104, 204, 304, 404 inactive.

With reference to FIG. 8, embodiments of the method according to the first aspect may include the step of:

keeping 502b every one 110, 222 of an electrical energy consumer 110 and an electrical energy producer 222 included in the second electrical circuit 104, 204, 304, 404 inactive.

The step of keeping 502a, 502b any one 110, 222, or every one 110, 222, of an electrical energy consumer 110 and an electrical energy producer 222 included in the second electrical circuit 104, 204, 304, 404 inactive implies that one or more electrical energy consumers 110 included in the second electrical circuit 104, 204, 304, 404 is/are prevented from consuming electrical energy and/or that one or more electrical energy producers 222 included in the second electrical circuit 104, 204, 304, 404 is/are prevented from producing electrical energy.

However, in alternative embodiments, the method may include the step of:

activating any one 110, 222 of an electrical energy consumer 110 and an electrical energy producer 222 included in the second electrical circuit 104, 204, 304, 404.

For example, when the electrical energy consumption of the electrical energy consumer 108 of the first electrical circuit 102 is different from the electrical energy consumption of the electrical energy consumer 110 of the second electrical circuit 104, and an electrical energy consumption value of each electrical energy consumer 108, 110 of the first and second electrical circuits 102, 104 (for example, the electrical energy consumer 108 of the first electrical circuit 102 may correspond to 5 ampere while the electrical energy consumer 110 of the second electrical circuit 104 may correspond to 10 ampere), or an electrical energy consumption relationship between the electrical energy consumer 108 of the first electrical circuit 102 and the electrical energy consumer 110 of the second electrical circuit 104 (for example, the electrical energy consumer 108 of the first electrical circuit 102 may correspond to a high electrical energy consumer while the electrical energy consumer 110 of the second electrical circuit 104 may correspond to a low electrical energy consumer), is known to the user or to a control arrangement 800, or an ECU 120, the different detections of the first and second sensor devices 116a, 116b will show which one 116a, 116b of the first and second sensor devices 116a, 116b is associated with which one 1000a, 1000b of the first and second electric battery units 1000a, 1000b. The corresponding procedure may be applied to electrical energy producers 222 included in the first and second electrical circuits 102, 104, or to a mixture of one or more electrical energy consumers 108, 110 and one or more electrical energy producers 222 included in the first and second electrical circuits 102, 104.

With reference to FIG. 8, embodiments of the method may comprise detecting 503 any one of a voltage change and an electric current change by one 116a, 116b of the first and second sensor devices 116a, 116b.

Figure 10:
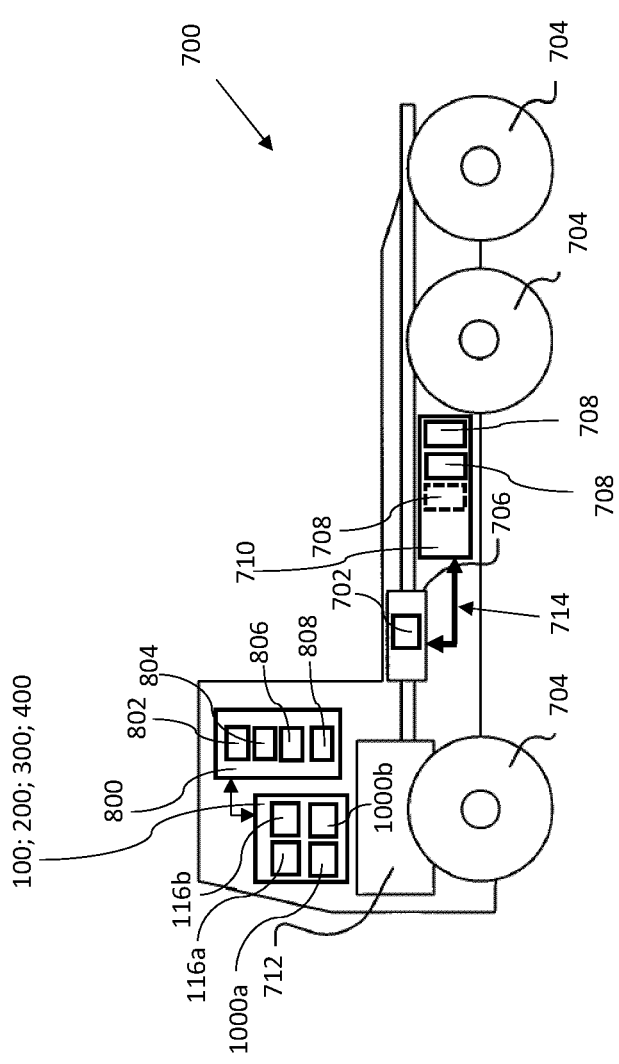
FIG. 10 is a schematic side view of an embodiment of the vehicle according to the fifth aspect.

With reference to FIG. 8, embodiments of the method may comprise determining 504 the association of a sensor device 116a, 116b with an electric battery unit 1000a, 1000b of a plurality of electric battery units 1000a, 1000b carried, or held, by a vehicle 700 (see FIG. 10).

With reference to FIG. 9, which schematically illustrates aspects of additional embodiments of the method according to the first aspect, and with reference to FIGS. 5 and 7, embodiments of the method may include the steps of:

switching 601 the switching device 450 to the non-conducting state before activating any one 108, 222 of an electrical energy consumer 108 and an electrical energy producer 222 (i.e., an electrical energy consumer 108 or an electrical energy producer 222) included in the first electrical circuit 102, 202, 302, 402;

when the switching device 450 is in the non-conducting state, activating 602 any one 108, 222 of an electrical energy consumer 108 and an electrical energy producer 222 included in the first electrical circuit 102, 202, 302, 402;

keeping 603a any one 110, 222 of an electrical energy consumer 110 and an electrical energy producer 222 included in the second electrical circuit 104, 204, 304, 404 inactive, or keeping 603b every one 110, 222 of an electrical energy consumer 110 and an electrical energy producer 222 included in the second electrical circuit 104, 204, 304, 404 inactive;

detecting 604 any one of a voltage change and an electric current change by one 116a, 116b of the first and second sensor devices 116a, 116b;

upon detection of any one of a voltage change and an electric current change by one 116a, 116b of the first and second sensor devices 116a, 116b, determining 605 that the one 116a, 116b of the first and second sensor devices 116a, 116b that detects any one of a voltage change and an electric current change is associated with the first electric battery unit 1000a of the first electrical circuit 102, 202, 302, 402; and optionally, determining 606 that the one 116a, 116b of the first and second sensor devices 116a, 116b that detects no voltage change and detects no electric current change is associated with the second electric battery unit 1000b of the second electrical circuit 104, 204, 304, 404.

In some embodiments of the method according to the first aspect, both the step of activating 501 an electrical energy consumer 108 included in the first electrical circuit 102, 202, 302, 402 to consume electrical energy and the step 501 of activating an electrical energy producer 222 included in the first electrical circuit 102, 202, 302, 402 to produce electrical energy may be performed.

Some embodiments of the method may instead include the steps of:

activating 501 any one 110, 222 of an electrical energy consumer 110 and an electrical energy producer 222 included in the second electrical circuit 104, 204, 304, 404, and upon detection of any one of a voltage change and an electric current change by one 116a, 116b of the first and second sensor devices 116a, 116b, determining 504 that the one 116a, 116b of the first and second sensor devices 116a, 116b which detects any one of a voltage change and an electric current change is associated with the second electric battery unit 1000b of the second electrical circuit 104, 204, 304, 404.

Unless disclosed otherwise, it should be noted that the method steps illustrated in FIGS. 8 and 9 and described herein do not necessarily have to be executed in the order illustrated in FIGS. 8 and 9. The steps may essentially be executed in any suitable order. Further, one or more steps may be added without departing from the scope of the appended claims. One or more steps may be excluded from the method without departing from the scope of the appended claims.

Steps of embodiments of the method may be performed after the installation of the first and second sensor devices 116a, 116b, for example upon assembly of an apparatus, such as a vehicle 700, to be provided with the first and second sensor devices 116a, 116b at a production site and/or upon later occurring maintenance work at a workshop. Steps of embodiments of the method may be performed after a software update of the first and second sensor devices 116a, 116b and/or of the control arrangement 800, or the ECU 120, to which the first and second sensor devices 116a, 116b may be connected.

With reference to FIG. 10, aspects of embodiments of the vehicle 700 according to the fifth aspect of the invention are schematically illustrated. The vehicle 700 may be referred to as a motor vehicle 700. In FIG. 10, the vehicle 700 is illustrated as a tractor vehicle. The tractor vehicle may, or may be configured to, haul, or pull, a trailer. The tractor vehicle may be defined as hauler. The tractor vehicle may be a hauling, or pulling, vehicle. The tractor vehicle may be referred to as a mover, or a prime mover, for example connectable, or attachable, to a trailer. However, in other embodiments, the vehicle 700 may, for example, be a bus, a truck, a heavy truck or a car. Other types of vehicles are also possible. The vehicle 700 may comprise or consist of an electric vehicle, EV, for example a hybrid vehicle or a hybrid electric vehicle, HEV, or a battery electric vehicle, BEV. Thus, an HEV and a BEV are examples of an EV. The EV may comprise one or more electric motors 702.

With reference to FIG. 10, the vehicle 700 may be a wheeled vehicle, i.e. a vehicle 700 having wheels 704. Only the wheels 704 on the left-hand side of the vehicle 700 are visible in FIG. 10. It is to be understood that the vehicle 700 may have fewer or more wheels than what is shown in FIG. 10.

With reference to FIG. 10, the vehicle 700 may include an electrical arrangement 100, 200, 300, 400 according to any of the above-mentioned examples. The electrical arrangement 100, 200, 300, 400 may be, or be part of (or included in), a vehicle electrical system of a vehicle 700, such as a vehicle low voltage system. It may be defined that the vehicle low voltage system is configured for a low voltage, such as a voltage below 60 V. It may be defined that the vehicle low voltage system is configured for direct current. The vehicle 700 may include a plurality of electric battery units 1000a, 1000b, for example as disclosed above or below. One or more of the electric battery units 1000a, 1000b of the plurality of electric battery units 1000a, 1000b may be configured to provide electric power to one or more of the group of: an electric motor; a starter motor; a heating system; a braking system; a steering system; a lighting system; a vehicle climate control system; a vehicle air condition system; and a ventilation system. Other electrical systems are possible. First and second sensor devices 116a, 116b, for example as disclosed above, may be connected to be located in the vehicle 700.

With reference to FIG. 10, the vehicle 700 comprises an embodiment of the control arrangement 800, for example according to any one of the embodiments disclosed below or above, for determining the association of a sensor device 116a, 116b with an electric battery unit 1000a, 1000b of a plurality of electric battery units 1000a, 1000b according to the fourth aspect of the invention.

With reference to FIG. 10, the vehicle 700 may comprise a powertrain 706, for example configured for one of an EV, HEV and BEV. The vehicle 700 may comprise, or carry, one or more electric batteries 708 and/or one or more electric battery packs 710 for the propulsion of the vehicle 700. The vehicle 700 may include one or more electric motors 702 or electrical machines, for example to propel, or drive, the vehicle 700. For example, the powertrain 706 may include the one or more electric motors 702 or electrical machines. The one or more electric motors 702 may be located in the transmission of the vehicle 700, or elsewhere in the vehicle 700. It may be defined that the powertrain 706 includes the one or more electric batteries 708 and/or the one or more electric battery packs 710. It is to be understood that the vehicle 700 may include further unites, components, such as electrical and/or mechanical components, a combustion engine 712 and other devices required for a vehicle 700, such as for an EV, HEV or BEV.

With reference to FIG. 10, for example, in some embodiments of the vehicle 700, the one or more electric batteries 708, the one or more electric battery packs 710 and the one or more electric motors 702 for the propulsion of the vehicle 700 are excluded from vehicle 700, wherein the powertrain 706 of the vehicle 700 is configured for a combustion engine 712 and the propulsion by a combustion engine 712 and not for an EV, HEV or BEV.

With reference to FIG. 10, the vehicle 700 may include a vehicle high voltage system 714, for example for direct current. It may be defined that the vehicle high voltage system 714 is configured for a high voltage, such as a voltage above 60 V, for example above 400 V, or above 450 V, such as above 650 V. For example, the vehicle high voltage system 714 may be configured for a voltage up to 1500 V. The electric power of the vehicle high voltage system 714 may be transferred at a high voltage, for example at one or more of the voltages levels mentioned above.

With reference to FIG. 10, the vehicle high voltage system 714 may be electrically connected to one or more electric batteries 708 and/or one or more electric battery packs 710 of the vehicle 700. The one or more electric batteries 708 may be one or more high voltage batteries. The one or more electric battery packs 710 may be one or more high voltage battery packs. The vehicle high voltage system 714 may be configured to electrically connect the one or more electric batteries 708 and/or the one or more electric battery packs 710 to the powertrain 706 of the vehicle 700, for example to the one or more electric motors 702 of the vehicle 700.

With reference to FIGS. 1-4, 10 and 11, aspects of embodiments of the control arrangement 800 for determining the association of a sensor device 116a, 116b with an electric battery unit 1000a, 1000b of a plurality of electric battery units according to the fourth aspect, are schematically illustrated. Embodiments of the control arrangement 800 are configured to:

activate 501 any one 108, 222 of an electrical energy consumer 108 and an electrical energy producer 222 included in the first electrical circuit 102, 202, 302, 402; and upon detection of any one of a voltage change and an electric current change (i.e. a voltage change or an electric current change) by one 116a, 116b of the first and second sensor devices 116a, 116b, determine 504 that the one 116a, 116b of the first and second sensor devices 116a, 116b which detects any one of a voltage change and an electric current change is associated with the first electric battery unit 1000a of the first electrical circuit 102, 202, 302, 402.

With reference to FIGS. 1-4 and 10, the illustrated embodiment of the control arrangement 800 includes an activation unit 802 for activating any one 108, 222 of an electrical energy consumer 108 and an electrical energy producer 222 included in the first electrical circuit 102, 202, 302, 402 in order to perform the steps 501 and 602 in FIGS. 8 and 9. In some embodiments, the activation unit 802 may be configured to keep any one 110, 222, or every one 110, 222, of an electrical energy consumer 110 and an electrical energy producer 222 included in the second electrical circuit 104, 204, 304, 404 inactive in order to performed the steps 502a, 502b, 603a, 603b in FIGS. 8 and 9.

With reference to FIGS. 1-4 and 10, the shown embodiment of the control arrangement 800 includes a determination unit 804 for determining that the one 116a, 116b of the first and second sensor devices 116a, 116b which is the sensor device 116a, 116b that detects any one of a voltage change and an electric current change is associated with the first electric battery unit 1000a of the first electrical circuit 102, 202, 302, 402 in order to perform the steps 504 and 605 in FIGS. 8 and 9. In some embodiments, the determination unit 804 may be configured to determine that the one 116a, 116b of the first and second sensor devices 116a, 116b that detects no voltage change and detects no electric current change is associated with the second electric battery unit 1000b of the second electrical circuit 104, 204, 304, 404 in order to perform step 606 in FIG. 9.

With reference to FIGS. 1-4 and 10, some embodiments of the control arrangement 800 may include a second determination unit 806 for determining if the switching device 450 of the electric current limiting device 106a, 106c (see FIGS. 5 and 7) is in the non-conducting state. Some embodiments of the control arrangement 800 may include a switch control unit 808 for switching the switching device 450 of the electric current limiting device 106a, 106c (see FIGS. 5 and 7) in order to perform the step 601 in FIG. 9. The switch control unit 808 may be configured to switch the switching device 450 to the non-conducting state. The switch control unit 808 may be configured to switch the switching device 450 between the non-conducting state and the conducting state.

With reference to FIGS. 1 to 4, in some embodiments, the control arrangement 800, or the ECU 120, is configured to directly or indirectly communicate, for example via signal lines (or cables or wires) or wirelessly, with one or more of the group of: an electric current limiting device 106; an electrical energy consumer 108, 110; an electrical energy producer 222; and an electrical generator 224; a first sensor device 116a; and a second sensor device 116b. Thus, in some embodiments, there may be one or more signal connections between the control arrangement 800, or the ECU 120, and one or more of the group of: an electric current limiting device 106; an electrical energy consumer 108, 110; an electrical energy producer 222; and an electrical generator 224; a first sensor device 116a; and a second sensor device 116b.

Figure 11:
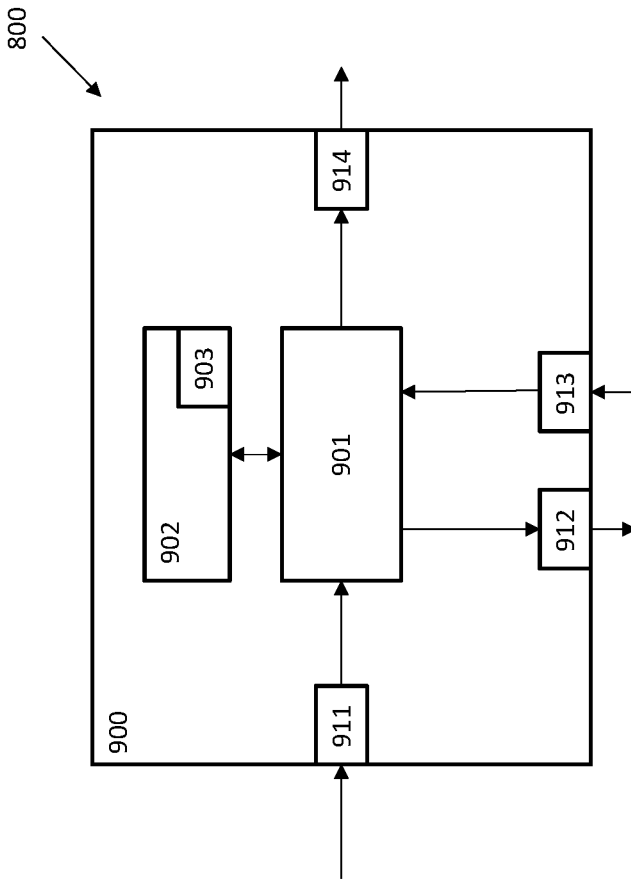
FIG. 11 is a schematic diagram illustrating an embodiment of the control arrangement according to the fourth aspect of the invention, in which a method according to any one of the herein described embodiments may be implemented.

FIG. 11 shows in schematic representation an embodiment of the control arrangement 800 according to the fourth aspect of the invention, which may include a control unit 900, which may correspond to or may include one or more of the above-mentioned units 802, 804, 806, 808 of the control arrangement 800. The control unit 900 may comprise a computing unit 901, which can be constituted by essentially any suitable type of processor or microcomputer, for example a circuit for digital signal processing (Digital Signal Processor, DSP), or a circuit having a predetermined specific function (Application Specific Integrated Circuit, ASIC). The computing unit 901 is connected to a memory unit 902 arranged in the control unit 900. The memory unit 902 provides the computing unit 901 with, for example, the stored program code and/or the stored data which the computing unit 901 requires to be able to perform computations. The computing unit 901 is also arranged to store partial or final results of computations in the memory unit 902.

With reference to FIG. 11, in addition, the control unit 900 may be provided with devices 911, 912, 913, 914 for receiving and transmitting input and output signals. These input and output signals can contain waveforms, impulses, or other attributes which, by means of the devices 911, 913 for the reception of input signals, can be detected as information and can be converted into signals which can be processed by the computing unit 901. These signals are then made available to the computing unit 901. The devices 912, 914 for the transmission of output signals are arranged to convert signals received from the computing unit 901 in order to create output signals by, for example, modulating the signals, which can be transmitted to other parts of and/or systems, for example in a vehicle 700 (see FIG. 10).

Each of the connections to the devices for receiving and transmitting input and output signals can be constituted by one or more of a cable; a data bus, such as a CAN bus (Controller Area Network bus), a MOST bus (Media Oriented Systems Transport bus), or some other bus configuration; or by a wireless connection.

Control systems in modern vehicles commonly comprise communication bus systems consisting of one or more communication buses for linking a plurality of electronic control units (ECU's), or controllers, and various components located on the vehicle. Such a control system can comprise a large number of control units and/or control arrangements and the responsibility for a specific function can be divided amongst more than one control unit. Vehicles of the shown type thus often comprise significantly more control units or control arrangements than are shown in FIG. 10, which is well known to the person skilled in the art within this technical field. Alternatively, or in addition thereto, embodiments of the present invention may be implemented wholly or partially in one or more other control units already present in a vehicle 700.

Here and in this document, units are often described as being provided for performing steps of the method according to embodiments of the invention. This also includes that the units are designed to and/or configured to perform these method steps.

With reference to FIGS. 1-4 and 10, the units 802, 804, 806, 808 of the control arrangement 800 are in FIGS. 1-4 and 10 illustrated as separate units. These units 802, 804, 806, 808 may, however, be logically separated but physically implemented in the same unit, or can be both logically and physically arranged together. These units 802, 804, 806, 808 may for example correspond to groups of instructions, which can be in the form of programming code, that are input into, and are utilized by a processor/computing unit 901 (see FIG. 11) when the units are active and/or are utilized for performing its method step.

With reference to FIGS. 10 and 11, the control arrangement 800, which may include one or more control units 900, e.g. a device or a control device, according to embodiments of the present invention may be arranged to perform all of the method steps mentioned above, in the claims, and in connection with the herein described embodiments. The control arrangement 800 is associated with the above described advantages for each respective embodiment.

According to the second aspect of the invention, a computer program 903 (see FIG. 11) is provided, comprising instructions which, when the program is executed by a computer, cause the computer to carry out the method according to one or more of the embodiments disclosed above.

According to the third aspect of the invention, a computer-readable medium is provided, comprising instructions which, when the instructions are executed by a computer, cause the computer to carry out the method according to one or more of the embodiments disclosed above.

The person skilled in the art will appreciate that the herein described embodiments of the method according to the first aspect may be implemented in a computer program 903, which, when it is executed in a computer, instructs the computer to execute the method. The computer program is usually constituted by a computer program product 903 stored on a non-transitory/non-volatile digital storage medium, in which the computer program is incorporated in the computer-readable medium of the computer program product. The computer-readable medium comprises a suitable memory, such as, for example: ROM (Read-Only Memory), PROM (Programmable Read-Only Memory), EPROM (Erasable PROM), Flash memory, EEPROM (Electrically Erasable PROM), a hard disk unit, etc.

Figure 12:
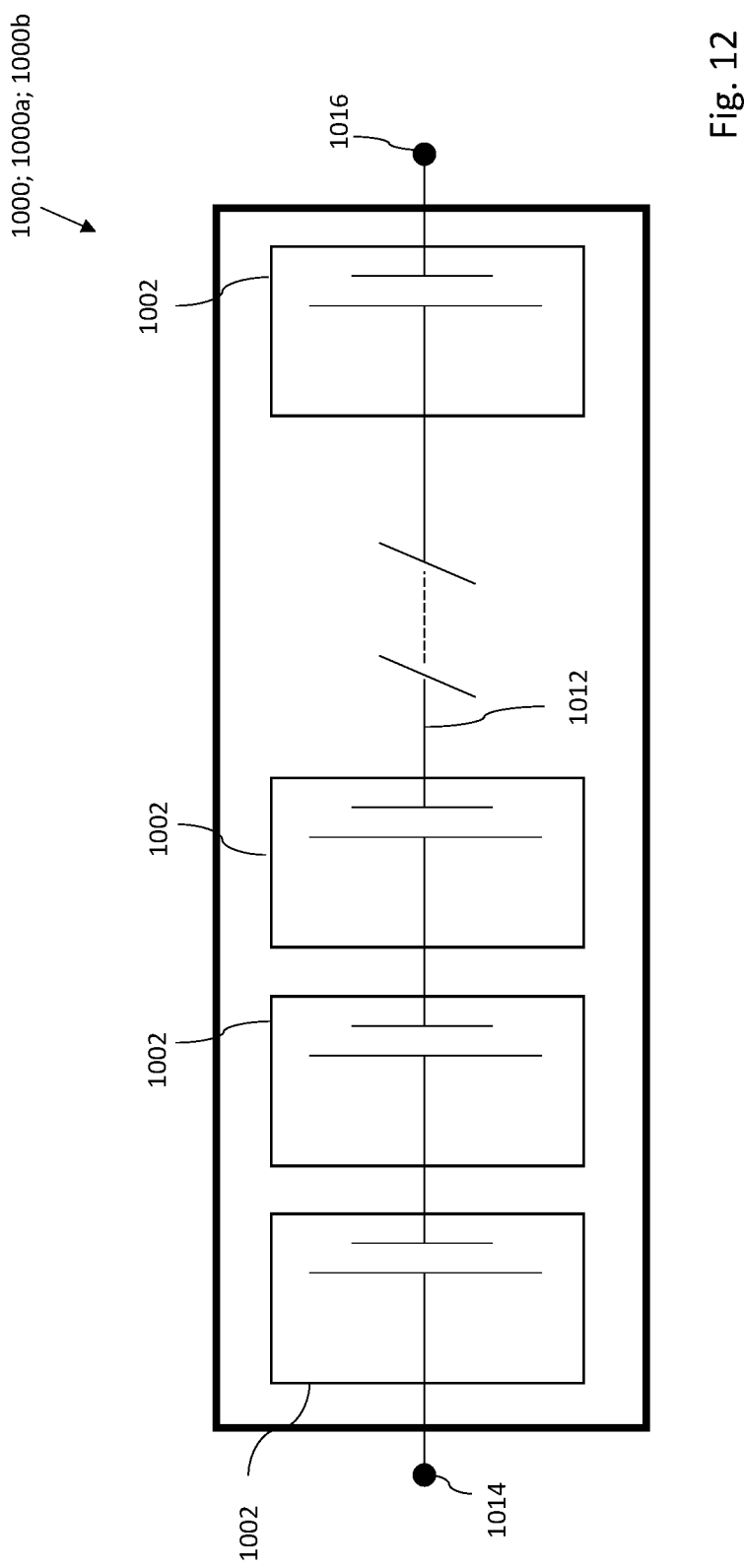
FIG. 12 is a schematic diagram illustrating an example of an electric battery unit.

FIG. 12 schematically illustrates an example of an electrical battery unit 1000, 1000a, 1000b which can be included in an electrical arrangement 100, 200, 300, 400, for example as disclosed above, to which embodiments of the invention may be applied. The electrical battery unit 1000, 1000a, 1000b may be referred to as one or more electric batteries 1000, 1000a, 1000b. However, it is to be understood that several other configurations of the electric battery units 1000a, 1000b of the plurality of electric battery units 1000a, 1000b disclosed above, such as the first and second electric battery units 1000a, 1000b, are possible. For example, for some embodiments, one or more items or features of the electrical battery unit 1000, 1000a, 1000b illustrated in FIG. 12 may be removed or may be added.

With reference to FIG. 12, the electrical battery unit 1000 may include one or more electric battery cells 1002 which may be arranged in a module. Each electric battery cell 1002 can be seen as a container chemically storing energy and may be a rechargeable electric battery cell. The electrical battery cell 1002 may for example be a lead-acid battery cell, a Li-ion battery cell or a NiMH battery cell but are not limited thereto. The electric battery cells 1002 may be electrically connected in series and in parallel, into the electric battery unit 1000 in order to attain the desired voltage and energy capacity. In shown embodiment, the electric battery cells 1002 are electrically connected in series with one another and are part of a main power line 1012. The electric battery unit 1000 may form the complete enclosure or unit that delivers electric power to a product or equipment, for example included in a vehicle 700, such as the vehicle 700 illustrated in FIG. 10.

With reference to FIG. 12, in general, the electrical battery unit 1000 has two terminals 1014, 1016 for connecting the electrical battery unit 1000 to an electrical system, for example a vehicle low voltage system. The two terminals 1014, 1016 (for example, DC positive and DC negative) may be disclosed as electrical contacts or poles. One of the two terminals 1014, 1016 may be a negative terminal having a negative pole, while the other one of the two terminals 1014, 1016 may be a positive terminal having a positive pole.

It is to be understood that embodiments of the method according to the first aspect, embodiments of the computer program 903 according to the second aspect, embodiments of the computer-readable medium according to the third aspect, and embodiments of the control arrangement 800 according to the fourth aspect may be applied to configurations or apparatuses different from a vehicle 700.

The present invention is not limited to the above-described embodiments. Instead, the present invention relates to, and encompasses all different embodiments being included within the scope of the independent claims.

The invention claimed is:

1. A method for determining the association of a sensor device with an electric battery unit of a plurality of electric battery units,
  wherein the plurality of electric battery units is connected to an electrical arrangement,
  wherein the electrical arrangement comprises a first electrical circuit comprising a first electric battery unit of the plurality of electric battery units,
  wherein the electrical arrangement comprises a second electrical circuit comprising a second electric battery unit of the plurality of electric battery units,
  wherein the electrical arrangement comprises an electric current limiting device connecting the first electrical circuit to the second electrical circuit, and
  wherein a first sensor device is connected to detect any one of a voltage and an electric current associated with one of the first and second electric battery units while a second sensor device is connected to detect any one of a voltage and an electric current associated with the other one of the first and second electric battery units,
  wherein the method comprises:
    activating any one of an electrical energy consumer and an electrical energy producer included in the first electrical circuit, and
    upon detection of any one of a voltage change and an electric current change by one of the first and second sensor devices, determining that the one of the first and second sensor devices which detects any one of a voltage change and an electric current change is associated with the first electric battery unit of the first electrical circuit.

2. A method according to claim 1, wherein the method comprises determining the association of a sensor device with an electric battery unit of a plurality of electric battery units carried by a vehicle.

3. A method according to claim 1, wherein one of the first and second sensor devices is connected to one of the first and second electric battery units while the other one of the first and second sensor devices is connected to the other one of the first and second electric battery units.

4. A method according to claim 1, wherein the electric current limiting device comprises a switching device switchable between a non-conducting state and a conducting state,
  wherein when the switching device is in the conducting state the switching device is configured to allow an electric current to pass,
  wherein when the switching device is in the non-conducting state the switching device is configured to interrupt an electric current, and wherein the method comprises:
  when the switching device is in the non-conducting state, activating any one of an electrical energy consumer and an electrical energy producer included in the first electrical circuit.

5. A method according to claim 4, wherein the switching device comprises or consists of an electric battery master switch.

6. A method according to claim 4, wherein the method comprises:
  switching the switching device to the non-conducting state before activating any one of an electrical energy consumer and an electrical energy producer included in the first electrical circuit.

7. A method according to claim 1, wherein the electric current limiting device comprises an electrical one-way conducting device configured to conduct electric current in one direction only.

8. A method according to claim 7, wherein the electrical one-way conducting device comprises a diode.

9. A method according to claim 1, wherein the step of activating any one of an electrical energy consumer and an electrical energy producer included in the first electrical circuit comprises activating the electrical energy consumer to consume electrical energy, whereupon an electric current is supplied from the first electric battery unit and detected by one of the first and second sensor devices.

10. A method according to claim 1, wherein the step of activating any one of an electrical energy consumer and an electrical energy producer included in the first electrical circuit comprises activating the electrical energy producer to produce electrical energy, whereupon the first electric battery unit is charged, and wherein the charging of the first electric battery unit is detected by one of the first and second sensor devices.

11. A method according to claim 10, wherein the electrical energy producer comprises an electrical generator, and wherein the step of activating any one of an electrical energy consumer and an electrical energy producer included in the first electrical circuit comprises activating the electrical generator to charge the first electric battery unit.

12. A non-transitory computer readable medium comprising a computer program that, when executed by a computer, causes the computer to perform the method according to claim 1.

13. A control arrangement for determining the association of a sensor device with an electric battery unit of a plurality of electric battery units,
  wherein the plurality of electric battery units is connected to an electrical arrangement,
  wherein the electrical arrangement comprises a first electrical circuit comprising a first electric battery unit of the plurality of electric battery units,
  wherein the electrical arrangement comprises a second electrical circuit comprising a second electric battery unit of the plurality of electric battery units,
  wherein the electrical arrangement comprises an electric current limiting device connecting the first electrical circuit to the second electrical circuit, and
  wherein a first sensor device is connected to detect any one of a voltage and an electric current associated with one of the first and second electric battery units while a second sensor device is connected to detect any one of a voltage and an electric current associated with the other one of the first and second electric battery units, wherein the control arrangement is configured to:

activate any one of an electrical energy consumer and an electrical energy producer included in the first electrical circuit, and upon detection of any one of a voltage change and an electric current change by one of the first and second sensor devices, determine that the one of the first and second sensor devices which detects any one of a voltage change and an electric current change is associated with the first electric battery unit of the first electrical circuit.

14. A vehicle comprising a control arrangement according to claim 13.

\* \* \* \* \*